US010761754B2

(12) United States Patent
Shen et al.

(10) Patent No.: US 10,761,754 B2
(45) Date of Patent: Sep. 1, 2020

(54) ADJUSTMENT OF A PRE-READ OPERATION ASSOCIATED WITH A WRITE OPERATION

(71) Applicant: Micron Technology, Inc., Boise, ID (US)

(72) Inventors: Zhenlei E. Shen, Milpitas, CA (US); Zhengang Chen, San Jose, CA (US); Tingjun Xie, Milpitas, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/057,537

(22) Filed: Aug. 7, 2018

(65) Prior Publication Data

US 2020/0050383 A1 Feb. 13, 2020

(51) Int. Cl.
*G06F 3/06* (2006.01)
*G11C 13/00* (2006.01)

(52) U.S. Cl.
CPC .......... *G06F 3/0634* (2013.01); *G06F 3/0604* (2013.01); *G06F 3/0679* (2013.01); *G11C 13/004* (2013.01)

(58) Field of Classification Search
CPC .... G06F 3/0634; G06F 3/0679; G06F 3/0604; G11C 13/004
See application file for complete search history.

(56) References Cited

U.S. PATENT DOCUMENTS

| 9,564,233 | B1 | 2/2017 | Cho et al. | |
|---|---|---|---|---|
| 2002/0018403 | A1* | 2/2002 | Brandt | G07C 3/02 368/107 |
| 2008/0086677 | A1 | 4/2008 | Yang et al. | |
| 2009/0319825 | A1 | 12/2009 | Yang et al. | |
| 2013/0290811 | A1 | 10/2013 | Liikanen et al. | |
| 2014/0226413 | A1* | 8/2014 | Gomez | G11C 16/3454 365/185.22 |
| 2017/0271031 | A1* | 9/2017 | Sharon | G06F 11/3037 |
| 2018/0226125 | A1* | 8/2018 | Terada | G11C 5/147 |

FOREIGN PATENT DOCUMENTS

KR 1020180082830 A 7/2018

OTHER PUBLICATIONS

PCT Notification of Transmittal of the International Search Report and The Written Opinion of the International Searching Authority for PCT Application No. PCT2019045423, dated Nov. 21, 2019, 11 pages.

* cited by examiner

*Primary Examiner* — Harry W Byrne
*Assistant Examiner* — Sultana Begum
(74) *Attorney, Agent, or Firm* — Lowenstein Sandler LLP

(57) ABSTRACT

Data can be received at a memory sub-system. A characteristic of the memory sub-system can be identified. A read voltage level can be determined based on the characteristic of the memory sub-system. A read operation can be performed at the memory sub-system based on the read voltage level to retrieve stored data. The received data can be stored at the memory sub-system based on the stored data that was retrieved from the read operation that is based on the read voltage level.

19 Claims, 9 Drawing Sheets

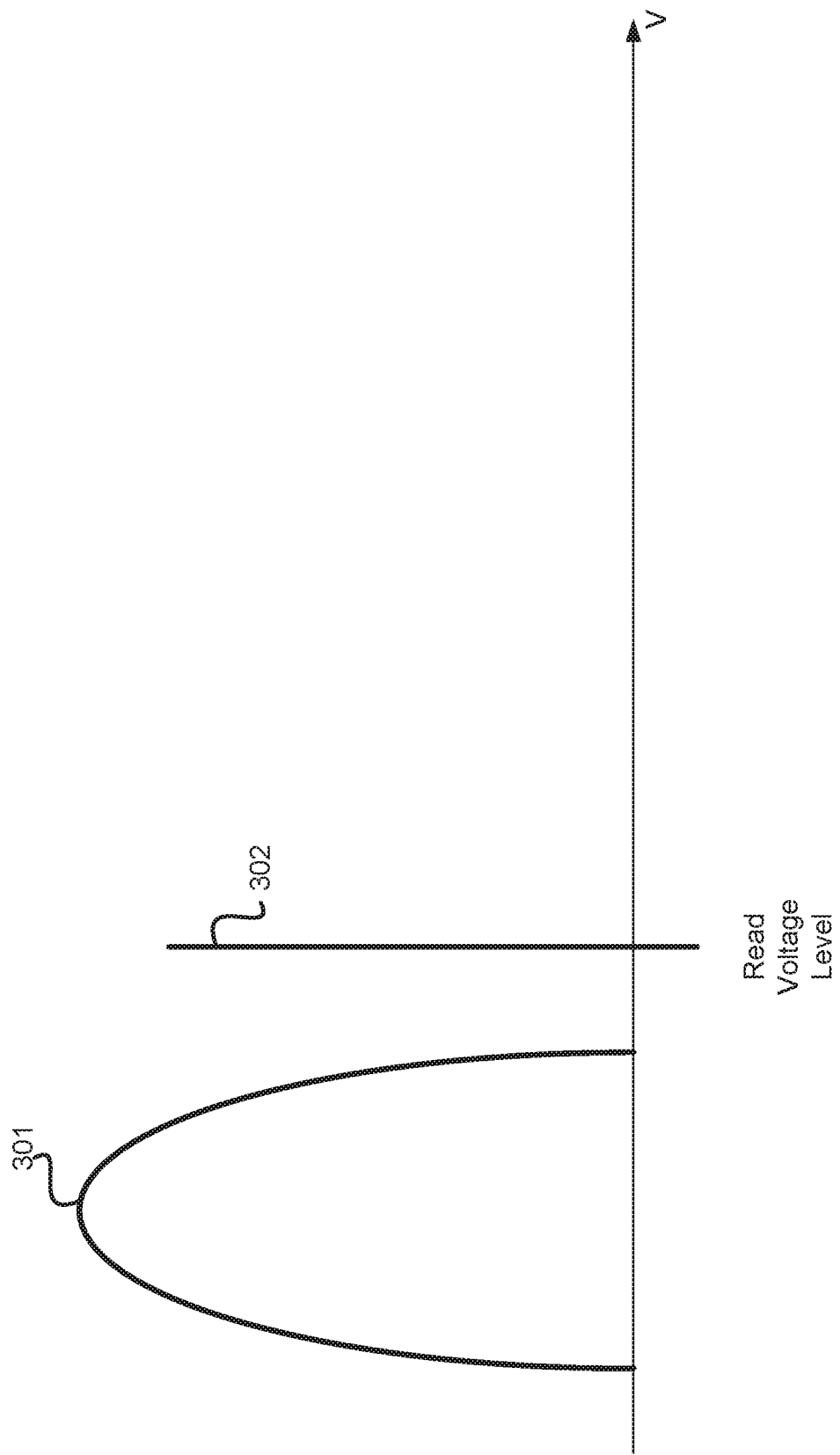

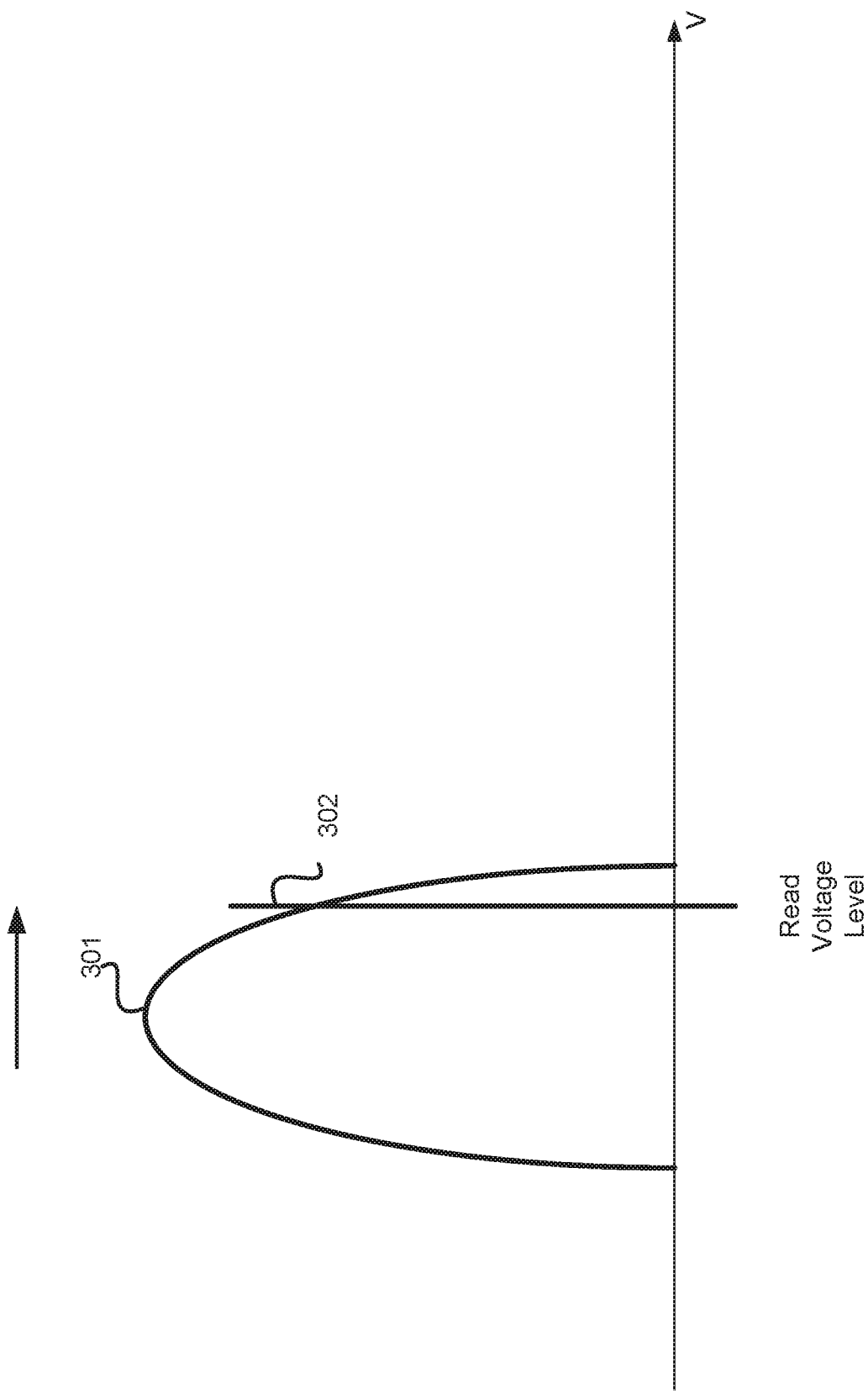

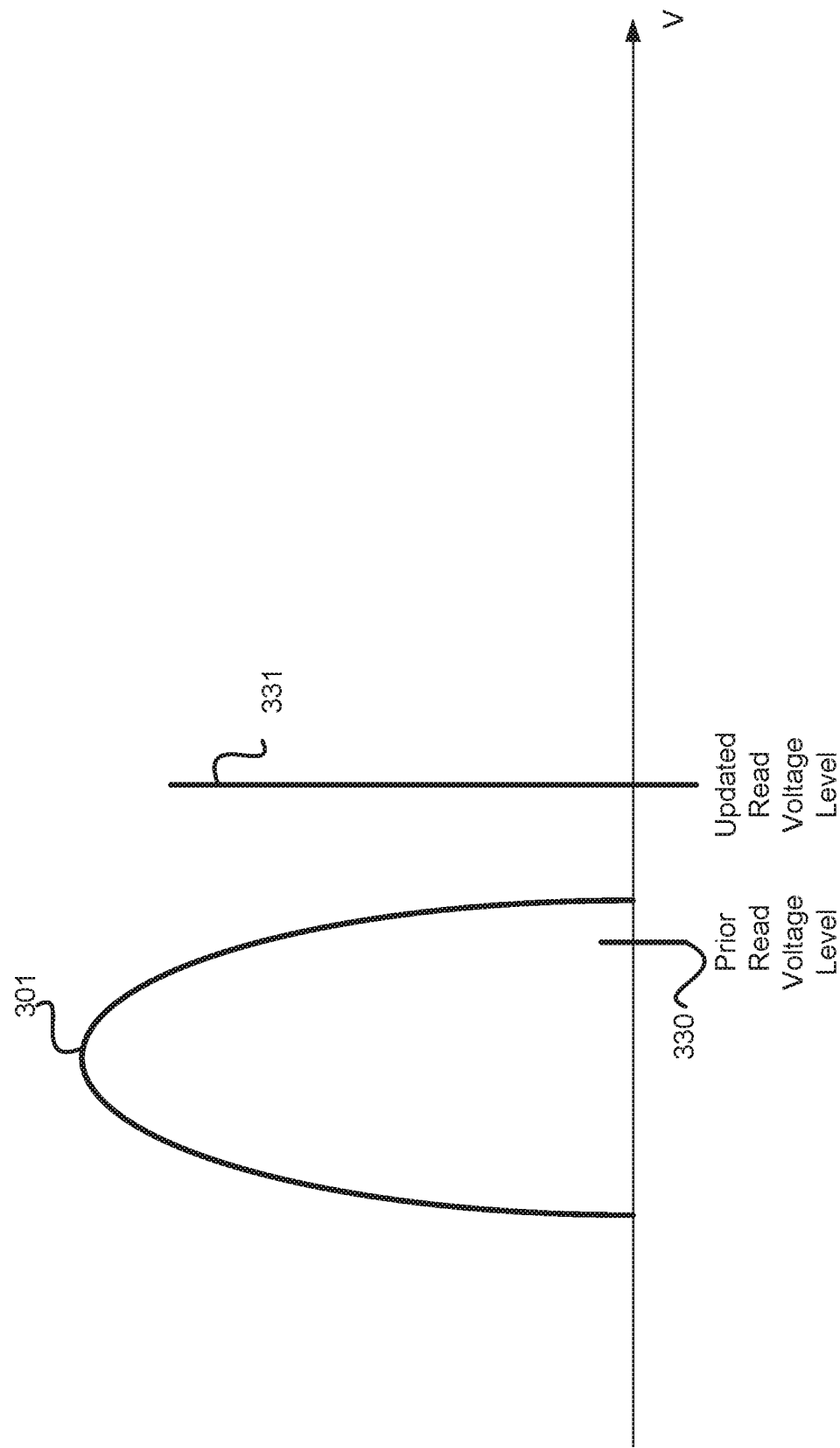

ADJUSTMENT OF A PRE-READ OPERATION ASSOCIATED WITH A WRITE OPERATION

TECHNICAL FIELD

The present disclosure generally relates to a memory sub-system, and more specifically, relates to the adjustment of a pre-read operation that is associated with a write operation in memory sub-systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 3A illustrates an example read voltage level to be applied to a memory cell in accordance with some embodiments of the present disclosure.

FIG. 3B illustrates the example read voltage level being applied to the memory cell with a voltage drift in accordance with some embodiments of the present disclosure.

FIG. 3C illustrates an adjusted read voltage level being applied to the memory cell with the voltage drift in accordance with some embodiments of the present disclosure.

DETAILED DESCRIPTION

Figure 1:
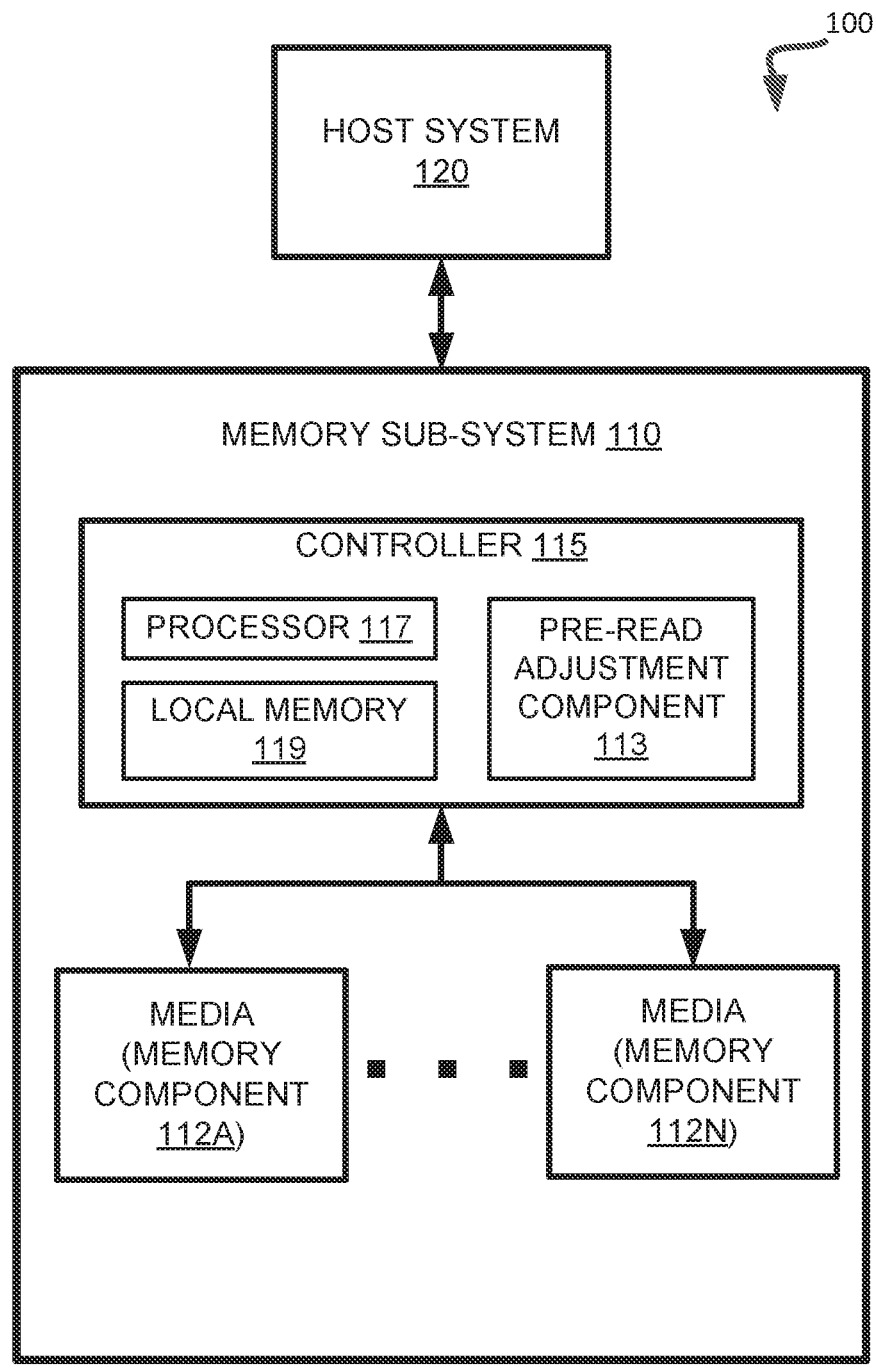
FIG. 1 illustrates an example computing environment that includes a memory sub-system in accordance with some embodiments of the present disclosure.

Aspects of the present disclosure are directed to the adjustment of a pre-read operation that is associated with a write operation. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

In a conventional memory sub-system, a read operation can be performed with a read voltage level. The read voltage level can be a particular voltage that is applied to memory cells of a memory component to read the data stored at the memory cells. For example, if a threshold voltage of a particular memory cell is identified as being below the read voltage level that is applied to the particular memory cell, then the data stored at the particular memory cell can be a particular value (e.g., '1') and if the threshold voltage of the particular memory cell is identified as being above the read voltage level, then the data stored at the particular memory cell can be another value (e.g., '0'). Thus, the read voltage level can be applied to memory cells to determine values stored at the memory cells.

The threshold voltage of a memory cell in a conventional memory sub-system can drift or change over time. When the threshold voltage of a memory cell changes, the application of the read voltage level can be inaccurate relative to the changed threshold voltage. For example, a memory cell can be programmed to have a threshold voltage below the read voltage level. The programmed threshold voltage can change over time and can shift to be above the read voltage level. For example, the threshold voltage of the memory cell can shift from initially being below the read voltage level to being above the read voltage level. As a result, when the read voltage level is applied to the memory cell, the data stored at the memory cell can be misread or misinterpreted to be at a wrong value as compared to the value as originally stored when the threshold voltage had not yet shifted.

Aspects of the present disclosure address the above and other deficiencies by adjusting the read voltage level. A memory sub-system can perform a pre-read operation that is associated with a write operation. The pre-read operation can be a read operation that is performed on memory cells that will store new data that is to be written to the memory cells. The memory sub-system can use the data retrieved from the pre-read operation to determine whether to change values of the memory cells to store the new data. For example, if a particular value of a memory cell that is retrieved from the pre-read operation matches a corresponding value of the new data, then the memory sub-system can determine to not change the memory cell as the value stored at the memory cell currently stores a value that matches a bit of the new data. Otherwise, if the particular value of the memory cell that is retrieved from the pre-read operation does not match the corresponding value of the new data, then the memory sub-system can change the value stored at the memory cell to match the value of the new data.

The pre-read operation can be performed by applying the read voltage level to a memory cell. The read voltage level that is to be applied in the pre-read operation can be adjusted to account for the drift or change of the threshold voltage of the memory cell over time. For example, one or more characteristics of the memory sub-system and/or memory cell can be identified. The threshold voltage of the memory cell can be inferred or assumed to have drifted or changed based on the one or more characteristics. In some embodiments, the characteristics can identify a condition of the memory cell or memory sub-system such as, but not limited to, a number of write operations that have been performed on the memory cell, an amount of time that has elapsed since data was last written to the memory cell, an error rate from read operations or pre-read operations, and an operating temperature of the memory cell or memory sub-system when data was written to the memory cell. The read voltage level can be adjusted based on such characteristics so that the read voltage level that is applied accounts for a change or drift in the threshold voltage.

As such, the write operation can utilize the pre-read operation that applies the adjusted read voltage level to more accurately retrieve the data stored at memory cells. Subsequently, the write operation can apply an additional voltage to program the memory cells based on a comparison of the retrieved data from the pre-read operation with the new data to be stored. If a new value and a value stored at a particular cell matches, then an additional voltage is not applied to program the particular memory cell. Otherwise, if the new value does not match the value stored at the particular memory cell, then the additional voltage can be applied to program the particular memory cell to change the currently stored value at the memory cell.

Advantages of the present disclosure include, but are not limited to, fewer error correction operations to be performed at the memory sub-system. For example, since the read voltage level is adjusted when performing the pre-read operation, then the retrieved data can be read with fewer errors that will need to be corrected with error correction operations. As a result, the performance of the memory sub-system can also be improved as other read operations or write operations can be performed since the memory sub-system is performing fewer error control operations. Additionally, since the data retrieved from the pre-read operation can be more accurate when using the adjusted read voltage level, then the memory sub-system can more frequently identify an accurate match between currently stored data and new data, resulting in fewer instances where additional voltage can be applied to a memory cell to change the value currently stored at the memory cell.

The memory sub-system can include cross point array based memory components where data can be written "in-place" (e.g., without performing an erase operation). For example, the memory sub-system can be any type of cross point array based memory sub-system such as a cross point array non-volatile dual in-line module (NVDIMM). In the same or alternative embodiments, the memory sub-system can include any other type of memory component.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a pre-read adjustment component 113 that can adjust a pre-read operation that is associated with a write operation. In some embodiments, the controller 115 includes at least a portion of the characteristic component 113. For example, the controller 115 can include a processor 117 (processing device) configured to execute instructions stored in local memory 119 for performing the operations described herein. In some embodiments, the characteristic component 113 is part of the host system 110, an application, or an operating system.

The memory sub-system 110 can include a pre-read adjustment component 113 (e.g., circuitry, dedicated logic, programmable logic, firmware, etc.) to perform the operations described herein. In some implementations, the pre-read adjustment component 113 can determine an adjusted read voltage level to be applied to memory cells of the memory components 112A to 112N during a pre-read operation. For example, the pre-read adjustment component 113 can identify characteristics of a memory component 112A to 112N and/or the memory sub-system 110. The characteristics can be used to determine the adjusted read voltage level to apply during the pre-read operation. Further details with regards to the operations of the pre-read adjustment component 113 are described below.

Figure 2:
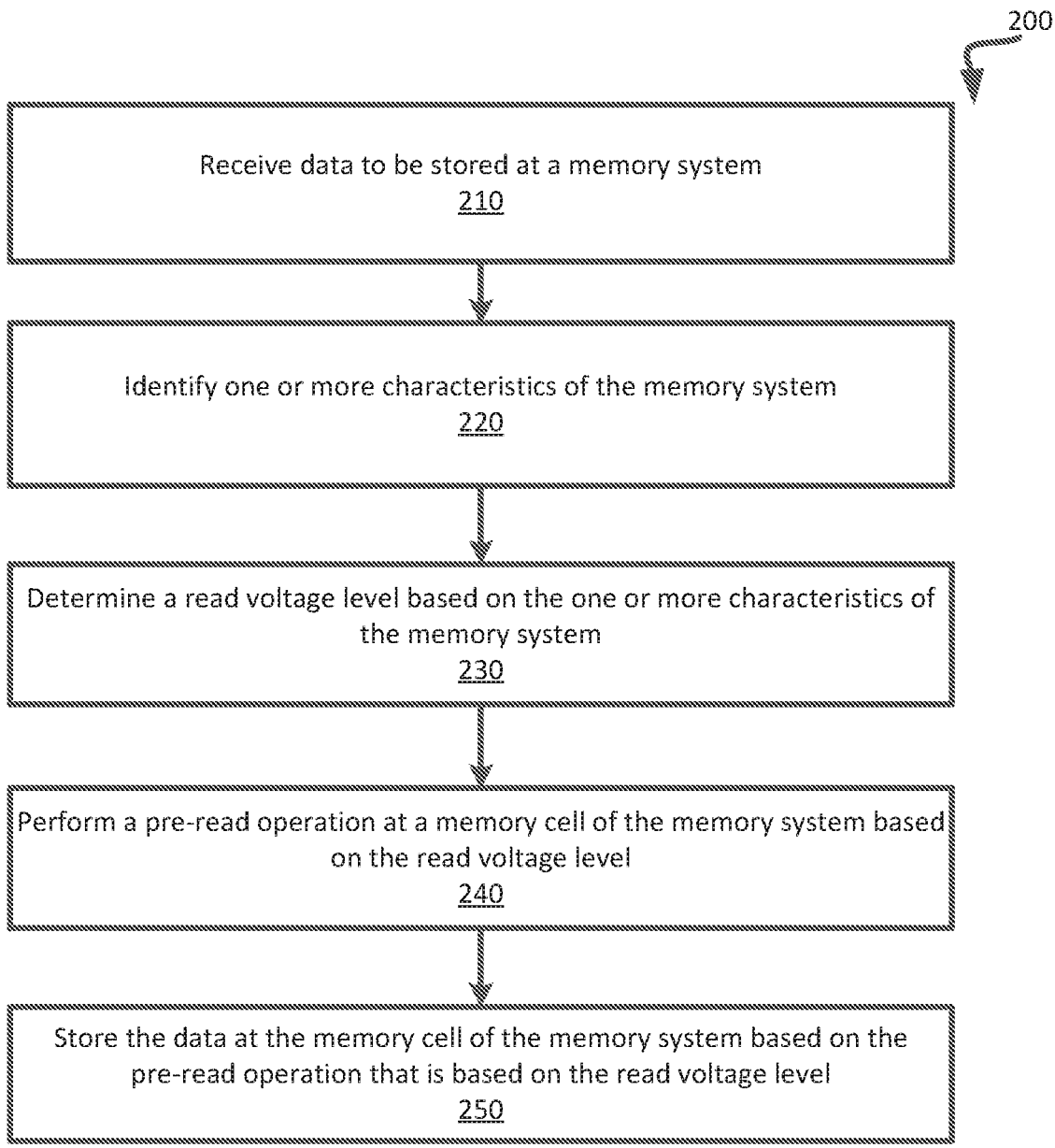
FIG. 2 is a flow diagram of an example method to adjust a read voltage level for a pre-read operation in accordance with some embodiments.

FIG. 2 is a flow diagram of an example method 200 to assign physical blocks of the memory sub-system to logical blocks of a system block in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the pre-read adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at block 210, the processing logic receives data to be stored at a memory sub-system. The data can be new data that has been received from a host system that is to be stored at the memory sub-system. At block 220, the processing logic identifies one or more characteristics of the memory sub-system. The one or more characteristics can identify a condition of a memory cell and/or memory component of the memory sub-system. Examples of the characteristics include, but are not limited to, a number of write operations that have been performed, an amount of elapsed time since a prior write operation has been performed, an observed error rate with data stored at the memory sub-system, and an operating temperature of the memory sub-system. Further details with regards to the characteristics that identify a condition of the memory cell and/or memory component of the memory sub-system are described in conjunction with FIG. 5.

Referring to FIG. 2, at block 230, the processing logic determines a read voltage level based on the one or more characteristics of the memory sub-system. The read voltage level can be adjusted or changed from a prior read voltage level. For example, a prior read voltage level may have been applied as part of a prior pre-read operation. The prior read voltage level can be a default read voltage level for the memory sub-system or a read voltage level that was previously determined based on prior characteristics of the memory sub-system. At block 240, the processing logic performs a pre-read operation at a memory cell of the memory sub-system based on the read voltage level. The pre-read operation can be a read operation that is performed before a write operation is to be performed. The pre-read operation can apply the read voltage level to the memory cell and determine a value stored at the memory cell based on the threshold voltage of the memory cell as previously described. At block 250, the processing logic stores the data at the memory cell of the memory sub-system based on the pre-read operation that is based on the read voltage level. For example, data stored at the memory cell can be retrieved by using the pre-read operation. The data at the memory cell can be compared with the received data. If the values of the data match, then the memory cell currently stores a value of the received data and the memory cell is not changed. Otherwise, if the values of the data do not match, then the value stored at the memory cell can be changed by programming the memory cell (e.g., applying an additional voltage).

FIG. 3A illustrates an example read voltage level to be applied to a memory cell in accordance with some embodiments of the present disclosure. The read voltage level can be applied by the pre-read adjustment component 113 of the memory sub-system 110 of FIG. 1.

As shown in FIG. 3A, a distribution of threshold voltages 301 represents threshold voltages of memory cells at a memory sub-system. The distribution of threshold voltages 301 can be threshold voltages that have been programmed to multiple memory cells. The read voltage level 302 can be applied to the memory cells when performing a read operation (e.g., a pre-read operation) at the memory cells. For example, as shown, a particular data value can be identified for all of the memory cells as the threshold voltages from the distribution of threshold voltages 301 are below or at a lower voltage level the read voltage level. The particular data value can be a value of '1.'

FIG. 3B illustrates the example read voltage level being applied to the memory cell with a threshold voltage drift in accordance with some embodiments of the present disclosure. As shown, the distribution of threshold voltages 301 can shift or change over time so that certain threshold voltages in the distribution of threshold voltages 301 have shifted from being below the read voltage level 302 to being above the read voltage level 302. As a result, although a particular memory cell was programmed to have a particular data value (e.g., the value of '1') that is represented by a threshold voltage being below the read voltage level, the threshold voltage of the particular memory cell can change over time to later be above the read voltage level. Thus, the particular memory cell was programmed to store a value of '1', but the read operation applying the read voltage level 302 to the particular memory cell can result in a different data value (e.g., '0') being identified at the particular memory cell.

FIG. 3C illustrates an adjusted read voltage level being applied to the memory cell with the voltage drift in accordance with some embodiments of the present disclosure. The adjusted read voltage level can be applied by the pre-read adjustment component 113 of the memory sub-system 110 of FIG. 1. As shown, an adjusted or updated read voltage level 331 can be used to perform read operations or pre-read operations for memory cells. The updated read voltage level 331 can be changed from the prior read voltage level 330 (e.g., the read voltage level 302 of FIGS. 3A and 3B). The updated read voltage level 331 can be above the distribution of threshold voltages 301, resulting in a more accurate reading of data at the memory cells represented by the distribution of threshold voltages 301.

Figure 4:
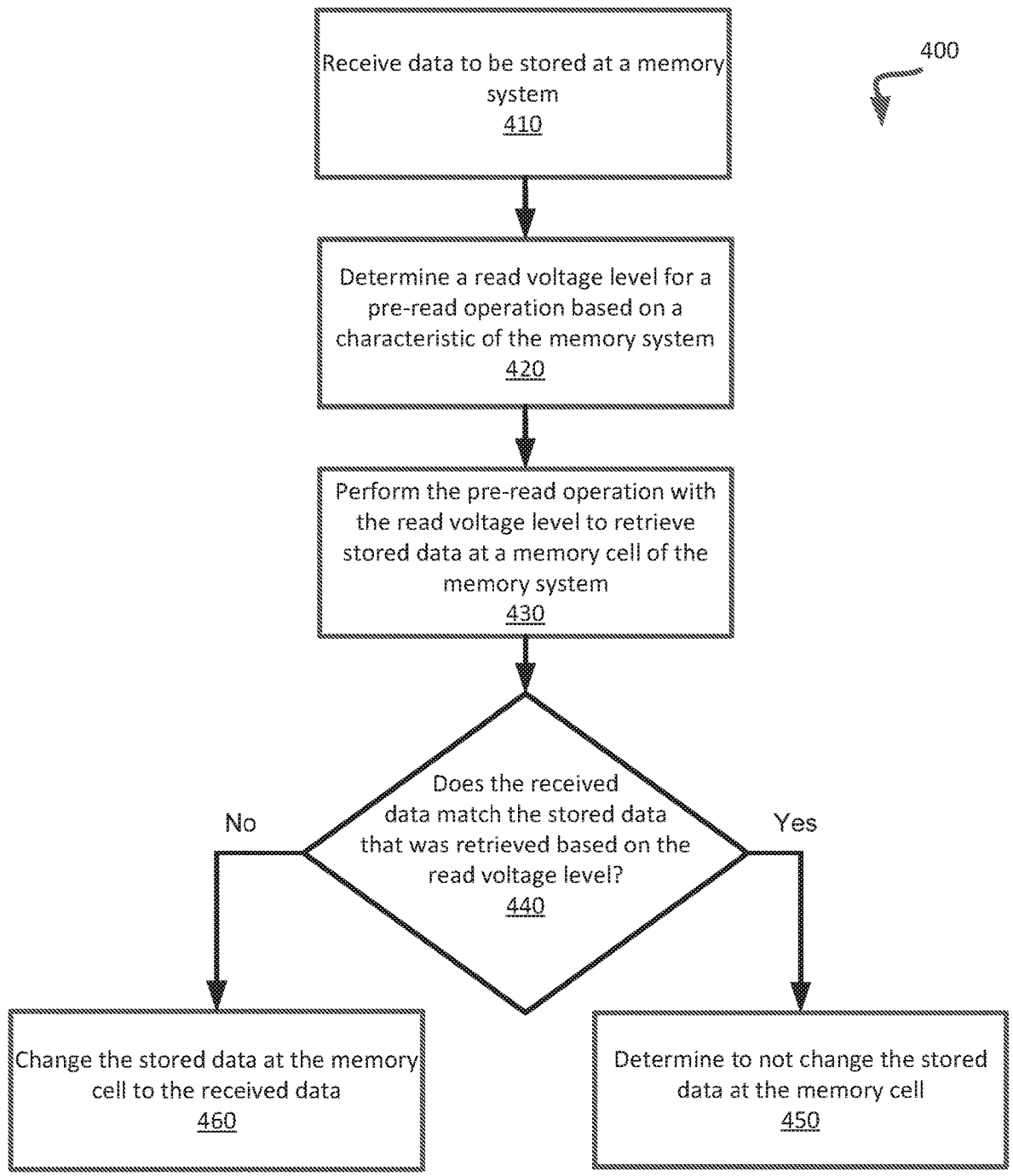
FIG. 4 is a flow diagram of an example method to perform a write operation with an adjusted pre-read operation in accordance with some embodiments.

FIG. 4 is a flow diagram of an example method 400 to perform a write operation with an adjusted pre-read operation in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the pre-read adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 4, at block 410, the processing logic receives data to be stored at a memory sub-system. At block 420, the processing logic determines a read voltage level for a pre-read operation based on a characteristic of the memory sub-system. For example, the read voltage level can be increased or decreased from a prior read voltage level that was previously used for another read operation or pre-read operation. The increasing or decreasing of the read voltage level can be determined when the characteristic of the memory sub-system indicates or can be used to infer that the threshold voltage of a memory cell of the memory sub-system has changed or shifted. At block 430, the processing logic performs the pre-read operation with the read voltage level to retrieve stored data at a memory cell of the memory sub-system. For example, the determined read voltage level can be applied to the memory cell and a value stored at the memory cell can be identified based on whether the threshold voltage of the memory cell is above or below the determined read voltage level. At block 440, the processing logic determines whether the received data matches with the stored data that was retrieved based on the read voltage level. If the received data matches with the stored data, then at block 450, the processing logic determines to not change the stored data at the memory cell. For example, the data currently stored at the memory cell is determined to be the same value as the received data or a corresponding portion of the received data. Otherwise, if the received data does not match with the stored data, then at block 460, the processing logic changes the stored data at the memory cell to the received data. For example, a programming operation can be performed on the memory cell to change the value of the memory cell.

As such, a write operation can include a pre-read operation and a programming operation that is performed based on a comparison of data retrieved from the pre-read operation and data currently stored at a memory cell. The read voltage level used in the pre-read operation can be based on a characteristic of the memory component.

Figure 5:
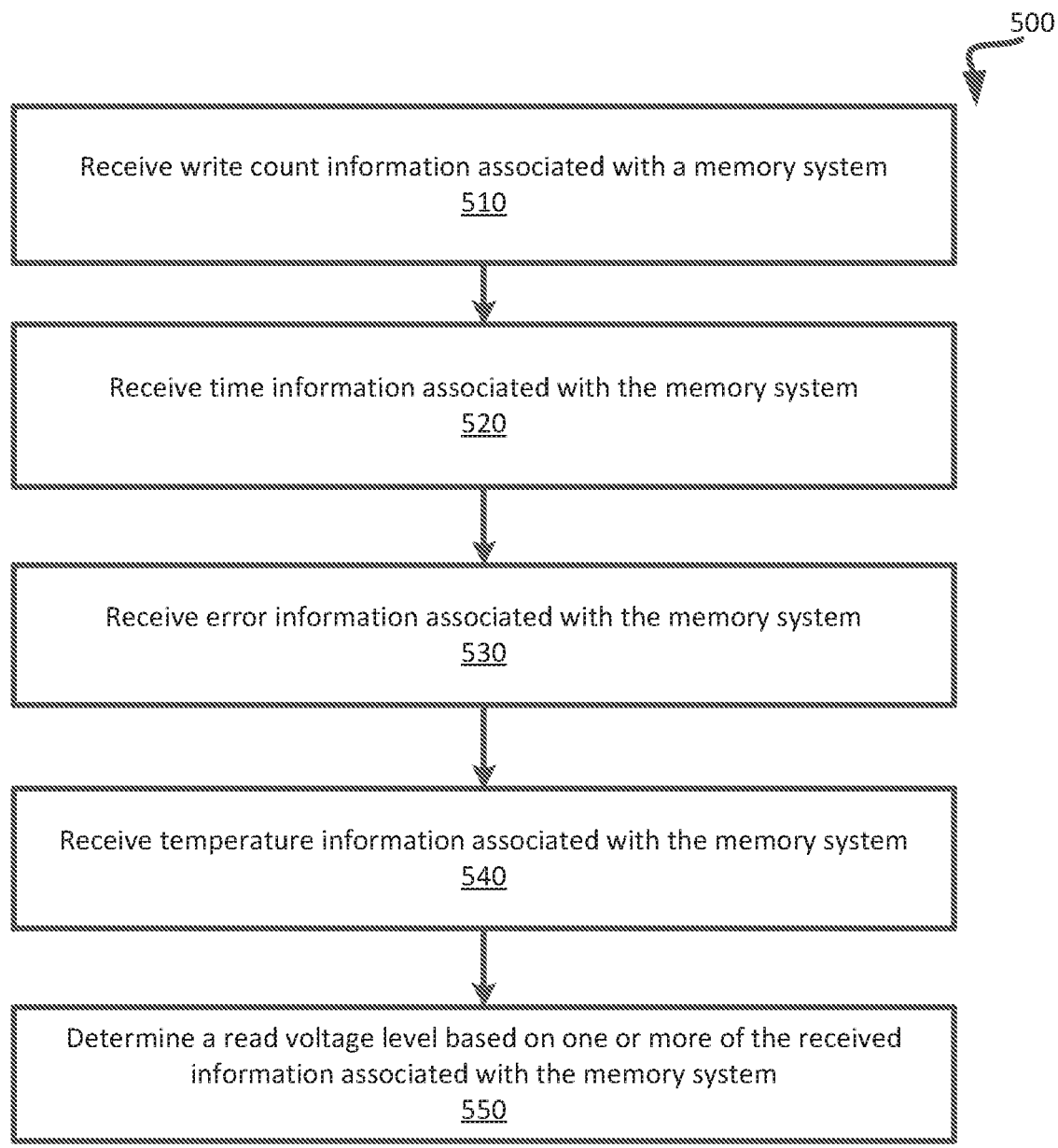
FIG. 5 is a flow diagram of an example method to determine a read voltage level for a pre-read operation in accordance with some embodiments.

FIG. 5 is a flow diagram of an example method to determine a read voltage level for a pre-read operation in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the pre-read adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, at block 510, the processing logic receives write count information associated with a memory sub-system. For example, a number of write operations that have been performed at the memory sub-system or that have been performed on a particular memory cell can be received. In some embodiments, when the number of write operations that have been performed exceeds a threshold number of write operations, then the threshold voltage of memory cells of the memory sub-system or the particular memory cell can be inferred or assumed to have changed. If the threshold is not exceeded, then the threshold voltage of the memory cells can be inferred or assumed to have not changed so that a new read voltage level should be applied. At block 520, the processing logic receives time information associated with the memory sub-system. For example, an amount of time that has elapsed since any write operation has been performed at the memory sub-system or at the particular memory cell can be received. In some embodiments, when the amount of time that has elapsed exceeds a threshold amount of time, then the threshold voltage of the memory cells of the memory sub-system or the particular memory cell can be inferred or assumed to have changed or shifted.

At block 530, the processing logic receives error information associated with the memory sub-system. For example, a number of times in a particular time period that a bit error (e.g., bit error rate) is identified from data that has been read at the memory sub-system or the particular memory cell can be identified. In some embodiments, the error rate can be identified from pre-read operations that have been performed with prior write operations. In some embodiments, when the error rate exceeds a threshold error rate, then the threshold voltage of the memory cells of the memory sub-system or the particular memory cell can be inferred or assumed to have changed or shifted. At block 540, the processing logic receives temperature information associated with the memory sub-system. For example, the operating temperature of the memory sub-system or the particular memory cell or the temperature at which data was stored at the memory sub-system or the particular memory cell can be received. In some embodiments, if the operating temperature is above or below a threshold temperature, then the threshold voltage of the memory cells of the memory sub-system or the particular memory cell can be inferred or assumed to have changed or shifted.

Referring to FIG. 5, at block 550, the processing logic determines a read voltage level based on one or more of the received information associated with the memory sub-system. In some embodiments, the memory sub-system can receive a single information associated with the memory sub-system. For example, the memory sub-system can receive one of the write count information, time information, error information, and temperature information. In the same or alternative embodiments, the memory sub-system can receive any combination of the write count information, time information, error information, and temperature information. The memory sub-system can determine an adjusted read voltage level based on the information that has been received. For example, the read voltage level can be adjusted from a prior read voltage level when at least one of the information indicates or can be used to infer that the threshold voltage has changed or shifted. In some embodiments, the read voltage level can be adjusted more when the corresponding information exceeds the respective threshold more. For example, the read voltage level can be adjusted more (e.g., a larger different in voltage) from the prior read voltage level when the temperature that exceeds the threshold temperature is larger or smaller than a prior temperature that also exceeded the threshold temperature.

In the same or alternative embodiments, the read voltage level can be determined each time that data is received at the memory sub-system to be stored at the memory sub-system. In some embodiments, the read voltage level can be determined when a change in condition of the memory sub-system is observed as described below.

Figure 6:
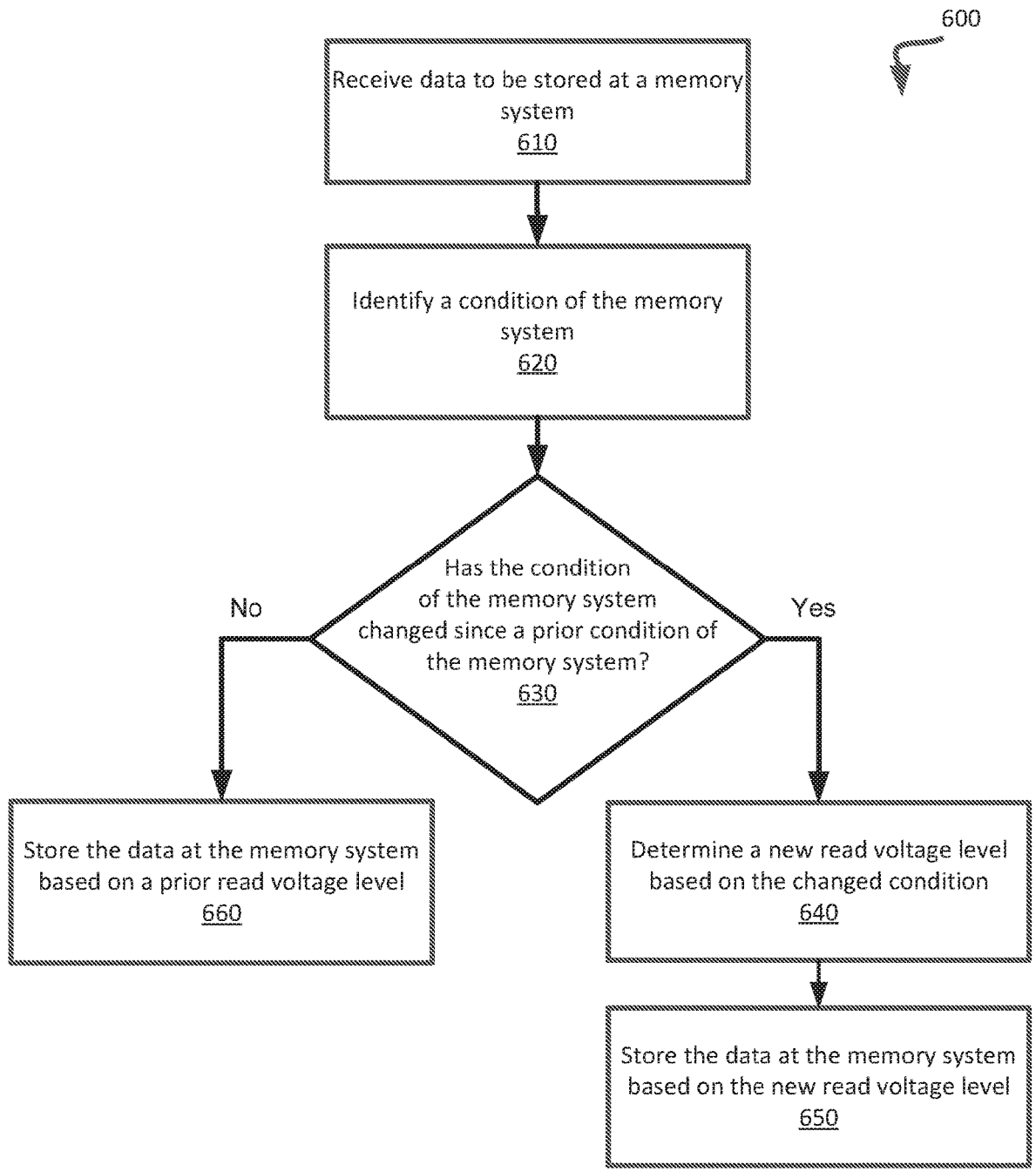
FIG. 6 is a flow diagram of an example method to identify an occurrence of a condition to determine a new read voltage level for a pre-read operation in accordance with some embodiments.

FIG. 6 is a flow diagram of an example method 600 to identify an occurrence of a condition to determine a new read voltage level for a pre-read operation in accordance with some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the pre-read adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 6, at block 610, the processing logic receives data to be stored at a memory sub-system. At block 620, the processing logic identifies a condition of the memory sub-system. The condition of the memory sub-system can be used to infer or assume a threshold voltage at memory cells of the memory sub-system. For example, the condition of the memory sub-system can be based on any combination of the write count information, time information, error information, temperature information, or other such information indicating a status of the memory sub-system. At block 630, the processing logic determines whether a condition of the memory sub-system has changed since a prior condition of the memory sub-system. For example, the memory sub-system can determine whether the condition of the memory sub-system has changed since new data has been received to be stored at the memory sub-system and prior data that was previously received and stored at the memory sub-system. In some embodiments, the condition can be determined to have changed based on any combination of the write count information, time information, error information, temperature information, etc. For example, the condition can be determined to have changed when a characteristic of the memory sub-system exceeds a corresponding threshold. For example, the characteristic can be the error information. The condition of the memory can be considered to be changed when the error rate from data read at the memory sub-system exceeds a threshold error rate and when the prior error rate from data read at the memory sub-system did not exceed the threshold rate. A change in the condition can indicate that the threshold voltage of the memory sub-system has changed. At block 640, the processing logic determines a new read voltage level based on the changed condition in response to determining that the condition of the memory sub-system has changed. For example, the new read voltage level can be adjusted from a prior read voltage level (e.g., increased or decreased). The amount of adjustment (e.g., voltage change) between the new read voltage level and the prior read voltage level can be based on the changed condition or how much the condition has changed since the prior condition. At block 650, the processing logic stores the data at the memory sub-system based on the new read voltage level.

Otherwise, at block 660, the processing logic stores the data at the memory sub-system based on a prior read voltage level in response to determining that the condition of the memory sub-system has not changed. For example, a prior read voltage level that was previously used to store prior data can be used again to store the received data at the memory sub-system. Thus, a read voltage level can be changed or adjusted for subsequent data to be stored at the memory sub-system.

As such, a new read voltage level can be determined when an observed change in the condition of the memory sub-system is identified. Otherwise, the prior read voltage can be continued to be used until the condition of the memory sub-system changes.

Figure 7:
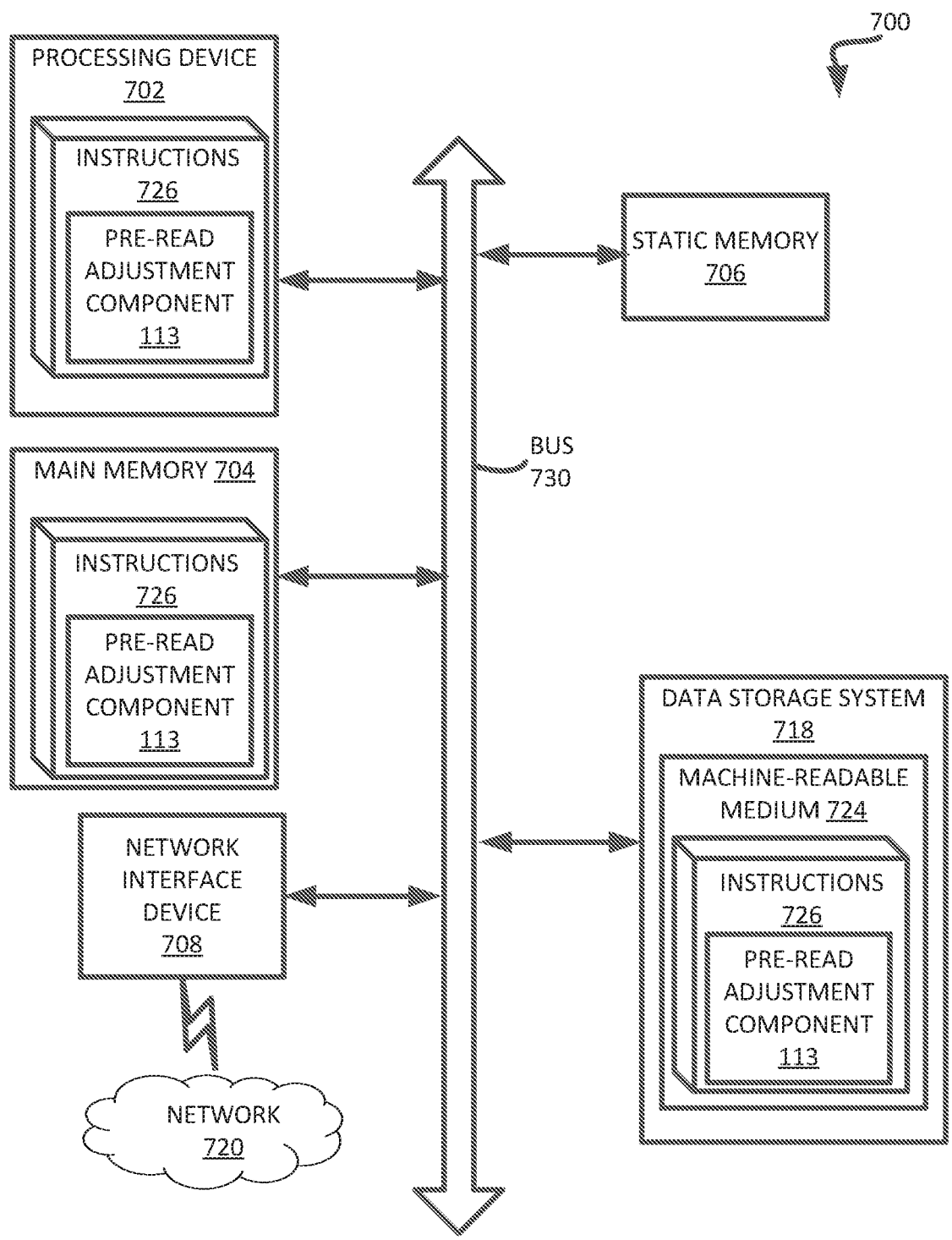
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the pre-read adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a pre-read adjustment component (e.g., the pre-read adjustment component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving first data at a memory sub-system;
identifying a characteristic of the memory sub-system, the characteristic comprising an amount of time that has elapsed since a prior write operation has been performed at the memory sub-system;
comparing the amount of time that has elapsed since the prior write operation to a threshold amount of time;
adjusting, by a processing device, a prior read voltage level to determine an adjusted read voltage level based on the amount of time that has elapsed since the prior write operation exceeding the threshold amount of time;
performing a read operation at the memory sub-system based on the adjusted read voltage level to retrieve second data; and
storing the first data at the memory sub-system based on the second data retrieved by the read operation that was based on the adjusted read voltage level.

2. The method of claim 1, wherein performing the read operation at the memory sub-system based on the adjusted read voltage level to retrieve the second data comprises:
applying the adjusted read voltage level to one or more memory cells of the memory sub-system, and wherein the adjusted read voltage level is different than the prior read voltage level applied to another memory cell of the memory sub-system.

3. The method of claim 1, wherein storing the first data at the memory sub-system based on the second data that was retrieved from the read operation comprises:
determining whether the first data matches with the second data that was retrieved from the read operation based on the read voltage level; and
changing a value stored at one or more memory cells of the memory sub-system responsive to the second data not matching the first data.

4. The method of claim 1, wherein the characteristic indicates that a threshold voltage for memory cells of the memory sub-system has changed, and wherein the adjusted read voltage level is based on the change of the threshold voltage.

5. The method of claim 1, wherein the characteristic is further based on a condition of the memory sub-system, the condition being one or more of a number of write operations performed at the memory sub-system, an error rate associated with data read from the memory sub-system, and an operating temperature of the memory sub-system.

6. The method of claim 1, wherein the read operation is performed before the storing of the first data.

7. The method of claim 1, wherein the memory sub-system comprises a cross point array based memory.

8. A system comprising:
a memory component; and
a processing device, operatively coupled with the memory component, to:
receive data at a memory sub-system;
identify a characteristic of the memory sub-system, the characteristic comprising an amount of time that has elapsed since a prior write operation has been performed at the memory sub-system;
compare the amount of time that has elapsed since the prior write operation to a threshold amount of time;
adjust a prior read voltage level to determine an adjusted read voltage level based on the amount of time that has elapsed since the prior write operation exceeding the threshold amount of time;
perform a read operation at the memory sub-system based on the adjusted read voltage level to retrieve stored data; and
store the received data at the memory sub-system based on the stored data that was retrieved from the read operation that is based on the adjusted read voltage level.

9. The system of claim 8, wherein to perform the read operation at the memory sub-system based on the read voltage level to retrieve the stored data, the processing device is further to:
apply the adjusted read voltage level to one or more memory cells of the memory sub-system, and wherein the adjusted read voltage level is different than the prior read voltage level applied to another memory cell of the memory sub-system.

10. The system of claim 8, wherein to store the received data at the memory sub-system based on the stored data that was retrieved from the read operation, the processing device is further to:
determine whether the received data matches with the stored data that was retrieved from the read operation based on the read voltage level; and
change a value stored at one or more memory cells of the memory sub-system when the stored data does not match the received data.

11. The system of claim 8, wherein the characteristic indicates that a threshold voltage for memory cells of the memory sub-system has changed, and wherein the adjusted read voltage level is based on the change of the threshold voltage.

12. The system of claim 8, wherein the characteristic is further based on a condition of the memory sub-system, the condition being one or more of a number of write operations performed at the memory sub-system, an error rate associated with data read from the memory sub-system, and an operating temperature of the memory sub-system.

13. The system of claim 8, wherein the read operation is performed before the storing of the received data.

14. The system of claim 8, wherein the memory sub-system comprises a cross point array based memory.

15. A non-transitory computer readable medium comprising instructions, which when executed by a processing device, cause the processing device to perform operations comprising:
- receiving data at a memory sub-system;
- identifying a condition of the memory sub-system, the condition comprising an amount of time that has elapsed since a prior write operation has been performed at the memory sub-system exceeds a threshold amount of time;
- in response to identifying the condition of the memory sub-system, determining a new read voltage level for the memory sub-system, wherein the new read voltage level is changed from a prior read voltage level used by the memory sub-system; and
- applying the new read voltage level to one or more memory cells of the memory sub-system to store the received data.

16. The non-transitory computer readable medium of claim 15, wherein the condition of the memory sub-system indicates that a threshold voltage for the one or more memory cells of the memory sub-system has changed.

17. The non-transitory computer readable medium of claim 15, wherein the condition is further one or more of a number of write operations performed at the memory sub-system, an error rate associated with data read from the memory sub-system, and an operating temperature of the memory sub-system.

18. The non-transitory computer readable medium of claim 15, wherein the one or more memory cells of the memory sub-system are associated with a cross point array based memory component.

19. The non-transitory computer readable medium of claim 15, wherein to apply the new read voltage level to the one or more memory cells of the memory sub-system to store the received data, the operations further comprise:
- retrieving stored data at the one or more memory cells based on the new read voltage level; and
- applying an additional voltage to the one or more memory cells when the stored data does not match with the received data.

* * * * *